（12）United States Patent
Wang et al.

(10) Patent No.: US 9,784,420 B2
(45) Date of Patent: Oct. 10, 2017

(54) LED DEVICE AND PREPARATION METHOD THEREOF

(71) Applicant: SICHUAN SUNFOR LIGHT CO., LTD., Sichuan, Chengdu (CN)

(72) Inventors: Sen Wang, Chengdu (CN); Kun Zhao, Chengdu (CN); Ming Zhang, Chengdu (CN)

(73) Assignee: SICHUAN SUNFOR LIGHT CO., LTD., Sichuan (CN)

( * ) Notice: Subject to any disclaimer, the term of this patent is extended or adjusted under 35 U.S.C. 154(b) by 11 days.

(21) Appl. No.: 15/079,965

(22) Filed: Mar. 24, 2016

(65) Prior Publication Data

US 2016/0201859 A1    Jul. 14, 2016

Related U.S. Application Data

(63) Continuation of application No. 14/360,353, filed as application No. PCT/CN2012/085147 on Nov. 23, 2012, now Pat. No. 9,328,879.

(30) Foreign Application Priority Data

Nov. 25, 2011  (CN) .......................... 2011 1 0382203
Jul. 31, 2012   (CN) .......................... 2012 1 0268433

(51) Int. Cl.
*F21K 9/60*  (2016.01)
*F21K 99/00* (2016.01)
(Continued)

(52) U.S. Cl.
CPC ............. *F21K 9/56* (2013.01); *F21K 9/64* (2016.08); *F21K 9/90* (2013.01); *F21V 3/0472* (2013.01);
(Continued)

(58) Field of Classification Search
CPC ... F21K 9/56; F21K 9/90; H01L 24/93; H01L 24/94; H01L 24/95; H01L 24/96; H01L 24/97; H01L 24/98; H01L 33/507
See application file for complete search history.

(56) References Cited

U.S. PATENT DOCUMENTS

2003/0080341 A1   5/2003   Sakano et al.
2008/0048200 A1   2/2008   Mueller et al.
(Continued)

FOREIGN PATENT DOCUMENTS

CN   201048138 Y   4/2008
CN   102037577 A   4/2011
(Continued)

OTHER PUBLICATIONS

International Search Report dated Mar. 7, 2013, in International Patent Application No. PCT/CN2012/085147.
File History of U.S. Appl. No. 14/360,353, filed Jul. 24, 2014.

*Primary Examiner* — Anne Hines
(74) *Attorney, Agent, or Firm* — Michael Ye; Andrews Kurth Kenyon LLP (57) ABSTRACT

The present invention provides a light-emitting diode (LED) device and a method for manufacturing the same. The LED device comprises: a substrate (1); a chip (2) disposed on the substrate (1); and a first lens (3) disposed on the substrate (1) and spaced from the chip (2); wherein the first lens (3) comprises luminescent powder (7) and at least one of light-diffusing particles (8) and light-reflecting particles (10). The LED device provided by the present invention has a high luminous efficiency, and solves the problem in the prior art that the LED device has a small angle of emergence and the emergent light emergence lacks of uniformity.

17 Claims, 5 Drawing Sheets

(51) Int. Cl.
  *F21V 3/04* (2006.01)
  *F21V 7/00* (2006.01)
  *H01L 33/50* (2010.01)
  *F21K 9/90* (2016.01)
  *F21K 9/64* (2016.01)

(52) U.S. Cl.
  CPC ............. *F21V 3/0481* (2013.01); *F21V 7/00* (2013.01); *H01L 33/507* (2013.01); *H01L 2933/0091* (2013.01)

(56) References Cited

U.S. PATENT DOCUMENTS

| | | |
|---|---|---|
| 2009/0045420 A1 | 2/2009 | Eng et al. |
| 2011/0006323 A1 | 1/2011 | Suzuki et al. |
| 2012/0087104 A1* | 4/2012 | Dai .......................... F21K 9/64 362/84 |

FOREIGN PATENT DOCUMENTS

| | | |
|---|---|---|
| CN | 102437276 A | 5/2012 |
| CN | 102769096 A | 11/2012 |
| JP | 2010239021 A | 10/2010 |

* cited by examiner

LED DEVICE AND PREPARATION METHOD THEREOF

This application is a continuation of U.S. patent application Ser. No. 14/360,353, filed on Jul. 24, 2014, which claims priority to PCT Application No. PCT/CN2012/05814, filed on Nov. 23, 2012, which claims priority to Chinese Patent Application No. 201110382203.8, filed on Nov. 25, 2011, and Chinese Patent Application No. 201210268433.6, filed Jul. 31, 2012. The entirety of the aforementioned applications is incorporated herein by reference.

TECHNICAL FIELD

The present invention relates to the technical field of lighting equipment, and particularly, to a light-emitting diode (LED) device and a method for manufacturing the same.

BACKGROUND

As a new type solid light source, the LED device not only has the advantages such as low power consumption, small volume, fast response speed, long working life, easy light regulation and color adjustment, energy saving and environmental protection, but also is highly superior to conventional light sources such as the incandescent lamp and the fluorescent lamp in the aspects of production, manufacturing and applicability. Thus the LED device has been significantly developed from its occurrence in 1960s. Currently, the LED device has been widely applied to various lighting fields, such as street lighting, landscape lighting, large screen display, traffic lights and indoor lighting.

The popular LED device is mainly achieved by exciting the yellow luminescent powder using the blue light. The conventional process forms the LED device by coating the mixed yellow luminescent powder and silica gel onto a blue chip and curing the silica gel through a heating. However, as for the LED device formed in the conventional process, the luminescent powder is directly contacted with the chip and the ambient temperature of the luminescent powder rises quickly when the chip works, thus the luminescent powder is aged due to the heat generated by the luminescence of the chip, and the luminous efficiency thereof is decreased. In addition, the chromaticity coordinates of the luminescent powder will also offset due to the temperature rise of the working environment, and finally influence the luminous efficiency, the emitting color and the service life of the LED device.

In order to solve the problem that the luminescent powder is easy to be aged in the conventional LED device, people have tried to dispose the luminescent powder and the chip separately during the manufacturing of the LED device. In the LED device of the prior art, although the luminescent powder is separated from the chip to slow down the aging speed of the luminescent powder, the obtained LED device has a small angle of emergence due to the limitation of the emergent angle of the LED chip. In addition, the light intensity distribution is nonuniform, i.e., at the same height from the chip, the light intensity is the strongest near around the right front of the chip, and gradually decreased with the increase of the distance to the center.

SUMMARY

In view of this matter, the present invention provides an LED device and a method for manufacturing the same, so as to solve the problems of the existing LED device, i.e., the angle of emergence is small, the lighting luminance lacks of uniformity, the luminous efficiency is low, and the occurrence of flares and glares.

According to an embodiment of the present invention, an LED device is provided, comprising: a substrate; a chip disposed on the substrate; and a first lens disposed on the substrate and spaced from the chip; wherein the first lens comprises luminescent powder and at least one of light-diffusing particles and light-reflecting particles. In which, the luminescent powder and at least one of the light-diffusing particles and the light-reflecting particles are individually disposed at an inner surface, an outer surface or an interior of the first lens, respectively. The light-diffusing particles can diffuse light emitted from the chip and the luminescent powder, while the light-reflecting particles can reflect light emitted from the chip.

According to another embodiment of the present invention, the LED device further comprises a light-reflecting layer disposed between the substrate and the chip.

Preferably, the light-reflecting layer may be arranged with a luminescent powder layer which covers the light-reflecting layer partially or entirely, with a thickness of preferably 0.1 to 3000 $\mu m$; components of the luminescent powder in the luminescent powder layer on the light-reflecting layer may differ from components of the luminescent powder on the first lens.

Preferably, in the LED device, the first lens comprises the luminescent powder and the light-reflecting particles, and more preferably, the luminescent powder, the light-reflecting particles and the light-diffusing particles. In which, the light-diffusing particles are glass beads or resin beads having a central diameter of 0.5 to 1000 $\mu m$; the light-reflecting particles comprise one or more of $TiO_2$, $ZnO$, $BaSO_4$, $CaCO_3$, and a composite material consisting of $TiO_2$ and $CaSO_4$. The $TiO_2$ is a rutile $TiO_2$ or an anatase $TiO_2$.

Based on a total mass of the first lens, contents of the light-reflecting particles, the light-diffusing particles and the luminescent powder are 0.01 wt % to 80 wt %, 0.05 wt % to 80 wt %, and 1 wt % to 99 wt %, respectively.

According to an embodiment of the present invention, when the lens is of a flat type, a distance between an inner surface of the first lens and the chip on the substrate is 0.1 to 200 mm.

According to another embodiment of the present invention, when the lens is a curved lens, a curvature radius of an inner side of the first lens relative to a geometric center of a surface of the chip facing the inner side of the first lens is 0.1 to 200 mm.

According to another embodiment of the present invention, the LED device further comprises a second lens disposed on an outer side of the first lens away from the chip in a manner of being spaced from the first lens. The second lens comprises one or two of the light-diffusing particles and the light-reflecting particles disposed at an outer surface, an inner surface or an interior of the second lens, and has a distance of 0.1 to 200 mm from the first lens.

The present invention further provides a method for manufacturing an LED device, comprising: providing a substrate; disposing a chip on the substrate; individually disposing luminescent powder and at least one of light-diffusing particles and light-reflecting particles on an outer surface, an inner surface or an interior of the first lens, respectively; and disposing the first lens having the luminescent powder and at least one of the light-diffusing particles and the light-reflecting particles on a side of the substrate where the chip is disposed, so that the first lens is spaced from the chip.

According to another embodiment of the present invention, the method further comprises forming a light-reflecting layer on the substrate before disposing the chip, so that the chip is located on the light-reflecting layer.

According to another embodiment of the present invention, the method further comprises disposing a second lens at an outer side of the first lens away from the chip, in a manner of being spaced from the first lens; a distance between an outer surface of the first lens and an inner surface of the second lens is 0.1 to 200 mm.

Preferably, the method further comprises individually disposing at least one of the light-diffusing particles and the light-reflecting particles at an outer surface, an inner surface or an interior of the second lens, respectively, before disposing the second lens.

According to another embodiment of the present invention, the method further comprises disposing a plurality of layers of lenses at an outer side of the second lens away from the first lens, in a manner of being spaced from each other, using the same method of disposing the second lens. In which, at least one of the light-diffusing particles and the light-reflecting particles and/or the luminescent powder may be individually disposed on an outer surface, an inner surface or an interior of each of the plurality of layers of lenses, respectively, before each of the plurality of layers of lenses is disposed.

As can be seen from the above technical solution, the LED device provided by the present invention comprises a first lens, as well as a second lens and a plurality of layers of lenses which are optional, each being provided with luminescent powder and at least one of light-diffusing particles and light-reflecting particles on an inner surface, an outer surface or an interior thereof, so the luminescent powder emits lights under the excitation of light emitted from the chip, and the light emitted from the luminescent powder diffuses all around through the light-diffusing particles, thus the emergency angle is increased, the phenomenon of glares and flares is eliminated, and the light intensity distribution is uniform. Meanwhile, the light-reflecting particles only reflect the light emitted from the chip, so that the light emitted from the chip is repeatedly reflected to the luminescent powder, thus the luminous efficiency is improved.

BRIEF DESCRIPTION OF THE DRAWINGS

In order to more clearly describe the technical solutions in the embodiments of the present invention or the prior art, the drawings to be used in the descriptions of the embodiments or the prior art will be briefly introduced as follows. Obviously, the following drawings just illustrate some embodiments of the present invention, and a person skilled in the art can obtain other drawings from these drawings without paying any creative effort.

DETAILED DESCRIPTION

In order that the objective, the technical solutions and the advantages of the present invention are clearer, the present invention will be further described in details through examples with reference to the drawings.

According to an embodiment of the present invention, an LED device is provided, comprising: a substrate; a chip disposed on the substrate; a first lens disposed on the substrate and spaced from the chip; and an optional light-reflecting layer disposed between the substrate and the chip. In which, the first lens comprises luminescent powder and at least one of light-diffusing particles and light-reflecting particles, wherein the luminescent powder, the light-diffusing particles and the light-reflecting particles are individually disposed at an inner surface, an outer surface or an interior of the first lens, respectively. The light-reflecting layer may be covered by a luminescent powder layer partially or entirely.

The substrate may be any conventional substrate for the LED, such as silicon substrate or aluminum substrate, without any particular requirement.

Figure 1:
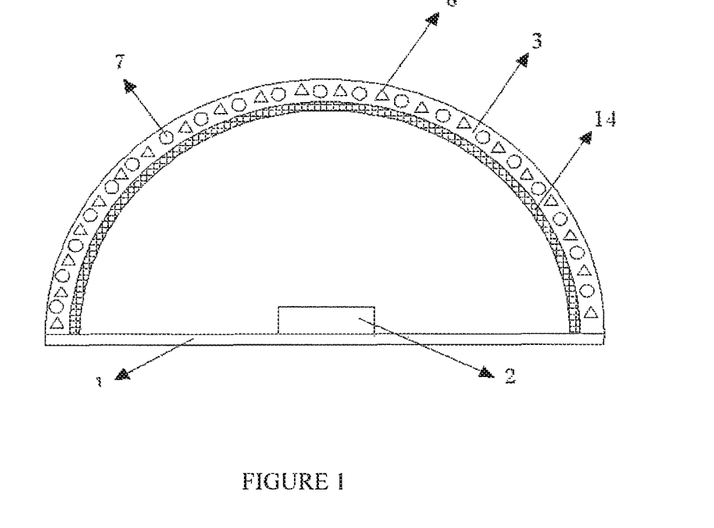
FIGS. 1 to 3 are structure diagrams of LED devices comprising different shapes of lenses according to a first embodiment of the present invention.
Figure 2:
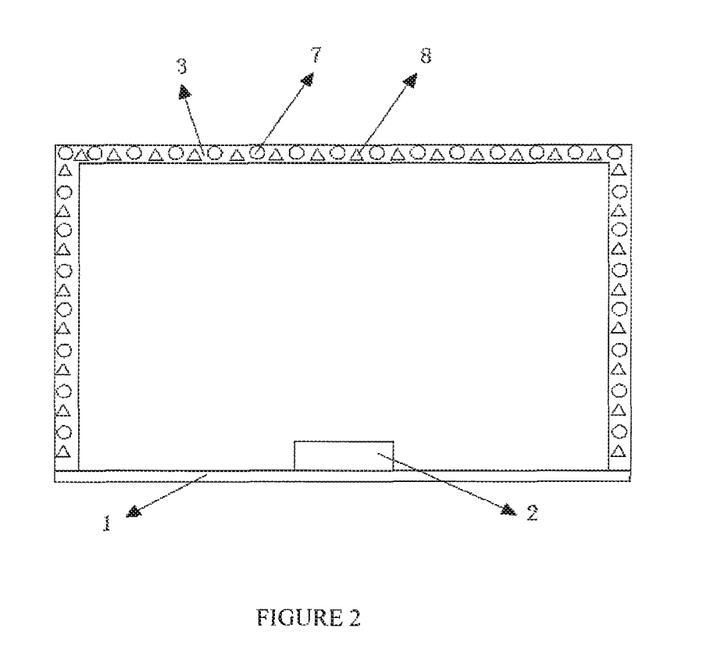
Figure 3:
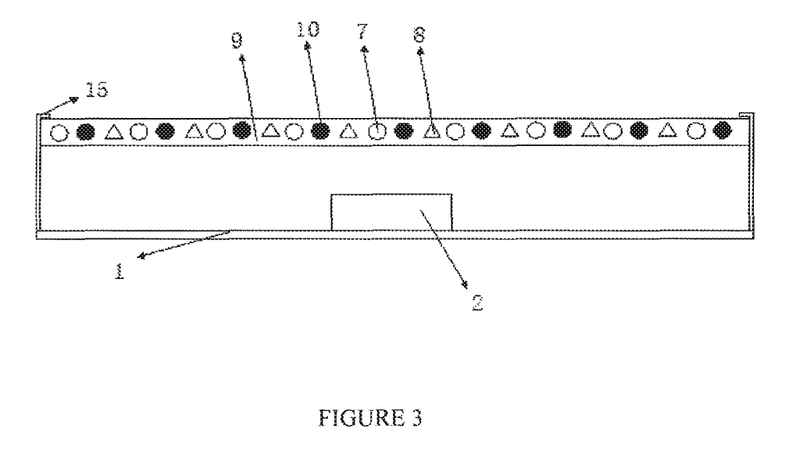

The first lens may be made of any material transparent to light emitted from the luminescent powder and the chip, such as glass, resin, optical plastics or ceramics, and may be shaped as a curved surface (as illustrated in FIG. 1), a square (as illustrated in FIG. 2) or in sharp of a flat panel (as illustrated in FIG. 3). The curved surface is preferably arc-shaped. When the light-diffusing particles, the light-reflecting particles and the luminescent powder are disposed at an inner surface or an outer surface of the lens, the first lens may be made of any of those materials. When the light-diffusing particles, the light-reflecting particles and the luminescent powder are disposed at the interior of the lens, the first lens is preferably made of glass, resin or optical plastics.

In the LED, the first lens may be a hemisphere or a square surrounding the chip, or disposed to face the chip parallelly, with a distance of 0.1 to 200 mm.

The chip may be any conventional chip for he LED, such as a chip emitting blue light, without any particular requirement.

There is no particular limitation to the luminescent powder, and it may be any luminescent powder available in the LED, such as yellow luminescent powder like $Y_3Al_5O_{12}:Ce^{3+}$ (YAG).

Preferably, in the LED device of the present invention, the light-diffusing particles in the lens have a refractive index between 1.20 and 2.40.

In the LED device, based on a total mass of the first lens, contents of the light-reflecting particles, the light-diffusing particles and the luminescent powder are 0.01 wt % to 80 wt %, 0.05 wt % to 80 wt %, and 1 wt % to 99 wt %, respectively, and preferably 0.01 wt % to 70 wt %, 0.05 wt % to 70 wt % and 1 wt % to 90 wt %.

The light-diffusing particles are made of a conventional material in the art, which is capable of diffusing light emitted from the chip and the luminescent powder, and light-transmissive. The light-diffusing particles preferably have a refractive index of 1.20 to 2.40, such as glass beads and resin beads, wherein the resin beads specifically are epoxy resin beads. In order that the light emitted from the chip is effectively diffused in respective directions, the light-diffusing particles have a medium particle diameter of 0.5 to 1000 .mu.m. If the medium particle diameter is smaller than 0.5 .mu.m, the light emitted from the chip will not be effectively diffused; and if the medium particle diameter is larger than 1000 .mu.m, the light emission efficiency will be decreased.

The light-reflecting particle may be any particle capable of reflecting light, preferably comprising one or more of $Al_2O_3$, $Y_2O_3$, $TiO_2$, ZnO, $BaSO_4$, $CaCO_3$, and a composite material consisting of $TiO_2$ and $CaSO_4$. The $TiO_2$ is a rutile $TiO_2$ or an anatase $TiO_2$. The light-reflecting particle has a medium particle diameter of 0.05 to 1000 μm. The light-reflecting particle having such a medium particle diameter can reflect light of a specific wavelength emitted from the chip, and transmit light of other wavelengths. Different light-reflecting particles, which can reflect light of a certain wavelength, are corresponding to different optimum particle diameters, and the details are shown in Table 1.

TABLE 1

| Material | Blue light (450 nm) | Green light (560 nm) | Red light (590 nm) |
|---|---|---|---|
| Rutile $TiO_2$ (nm) | 140 | 192 | 205 |
| Anatase $TiO_2$ (nm) | 158 | 215 | 230 |
| ZnO (nm) | 275 | 389 | 416 |
| $BaSO_4$ (nm) | 1070 | 1300 | 1360 |
| $CaCO_3$ (nm) | 1440 | 1740 | 1840 |
| 50% $TiO_2$ mixed with 50% $CaSO_4$ (nm) | 193 | 267 | 285 |
| 30% $TiO_2$ mixed with 70% $CaSO_4$ (nm) | 260 | 360 | 383 |

Table 1 lists the optimum particle diameters of different types of light-reflecting particles in the case of reflecting blue light (wavelength: 450 nm), green light (wavelength: 560 nm) and red light (wavelength: 590 nm). According to Table 1 and in conjunction with the LED device illustrated in FIG. 5, if a chip 2 in the LED device is a blue chip (i.e., a chip emitting blue light), light-reflecting particles 10 in the first lens are required to be able to emit blue light and transmit light having a longer wavelength than the blue light. As can be seen from Table 1, if the light-reflecting particles 10 are rutile $TiO_2$, the medium particle diameter of the light-reflecting particles 10 is preferably set between 140 nm and 192 nm, so that the light-reflecting particles 10 can effectively reflect the blue light, while transmitting green light, red light, etc. having a longer wavelength than the blue light. Thus, for specific chip and light-reflecting particles in the LED device, corresponding medium particle diameter of the light-reflecting particles may be set, so that the light-reflecting particles can reflect light emitted from the chip and transmit light having a longer wavelength than the light emitted from the chip. The chip in the LED device provided by the present invention may be a chip emitting light of other wavelength, in addition to the blue chip.

When the luminescent powder, the light-diffusing particles and the light-reflecting particles are disposed on the surface of the lens, they can be formed on an inner surface or an outer surface of the molded lens through coating, thermal spraying, electrostatic spraying, silk-screen printing, etc. When the luminescent powder, the light-diffusing particles and the light-reflecting particles are disposed at the interior of the lens, they may be doped into their base materials such as resin, glass, optical plastics, ceramics, etc. before the lens is molded, thereby forming the lens through a conventional molding method.

There is no particular limitation to the light-reflecting layer optionally disposed between the substrate and the chip, and its available examples include aluminum oxide, titanium oxide, etc., with a purpose that when the light-diffusing particles or the light-reflecting particles diffuse or reflect the light emitted from the chip to the substrate, the light-reflecting layer further reflects the light to the luminescent powder, thereby further exciting the luminescent powder to emit light, so as to improve the utilization efficiency of the light emitted from the chip, and increase the luminous efficiency of the LED device.

The technical solutions of the embodiments of the present invention will be clearly and completely described as follows with reference to the drawings, and the same reference sign denotes the same element throughout the specification. Obviously, those described herein are just parts of the embodiments of the present invention rather than all the embodiments. Based on the embodiments of the present invention, any other embodiment obtained by a person skilled in the art without paying a creative effort shall fall within the protection scope of the present invention.

Referring to FIG. 1, an LED device provided according to a first embodiment of the present invention comprises: a substrate 1; a chip 2 disposed on the substrate 1; a curved lens 3 disposed on the substrate 1 and covering the chip 2; luminescent powder 7 and light-diffusing particles 8 disposed at an interior of the lens 3.

In the specific working process, the light emitted from the chip 2 is radiated to the lens 3. Some of the light is radiated to the luminescent powder 7 to excite it to emit light, some of the light is radiated to the light-diffusing particles 8 and diffused all around, and some of the light is emergent after being transmitted by the lens 3. A combination of the light emergent after being transmitted by the lens 3 and the light emitted by the excited luminescent powder 7 becomes the light emitted by the LED device.

The light-diffusing particles 8 may be glass beads, which effectively diffuses all around the light emitted from the chip 2 and the light emitted by the excited luminescent powder 7, thereby increasing the light-emitting angle and luminous efficiency of the LED device. This embodiment increases the emergent angle of the LED device by adding the light-diffusing particles 8.

When the light-diffusing particles 8 diffuses all around the light emitted from the chip 2, some of the light is radiated to the luminescent powder 7 to excite it to emit light, thereby enabling the luminescent powder 7 to absorb the light emitted from the chip 2 to the largest extent, so as to improve the luminous efficiency of the LED device.

Optionally, in the embodiment as illustrated in FIG. 1, a support lens 14 tightly contacting the lens 3 may be further disposed at an inner side of the lens 3 towards the chip. When the lens 3 is made of a soft light-transmitting material, the support lens is made of a hard light-transmitting material. In this embodiment, the soft light-transmitting material may be silicone rubber, and the hard light-transmitting material may be one of glass, polymethyl methacrylate (PMMA) and polycarbonate (PC) material or combinations thereof.

Figure 4:
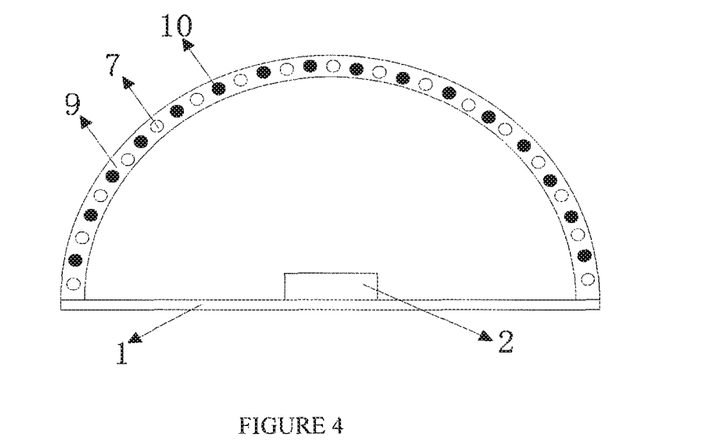
FIGS. 4 to 9 are structure diagrams of LED devices according to the second to sixth embodiments of the present invention.

Referring to FIG. 4, an LED device provided according to a second embodiment of the present invention comprises: a substrate 1; a chip 2 disposed on the substrate 1; a lens 9 disposed on the substrate 1 and covering the chip 2; and luminescent powder 7 and light-reflecting particles 10 disposed at an interior of the lens 9.

In the specific working process, the light emitted from the chip 2 is radiated to the lens 9. Some of the light is radiated to the luminescent powder 7 to excite it to emit light, some of the light is radiated to the light-reflecting particles 10 and diffused all around while reflected to the substrate 1, and some of the light is emergent after being transmitted by the lens 9. A combination of the light emergent after being transmitted by the lens 9 and the light emitted by the excited luminescent powder 7 becomes the light emitted by the LED device.

In this embodiment, the light emitted from the chip 2 is reflected to the chip by the light-reflecting particles 10, and further reflected by the chip and the substrate. In that case, some of the light is radiated to the luminescent powder 7 to excite it to emit light, and some of the light is emergent after being transmitted by the lens. Thus, the luminescent powder 7 is more efficiently excited by the light emitted from the chip 2 to improve the luminous efficiency of the LED device. Therefore, the LED device provided by this embodiment has the advantages of large angle of emergence, uniform luminance and high luminous efficiency.

Figure 5:
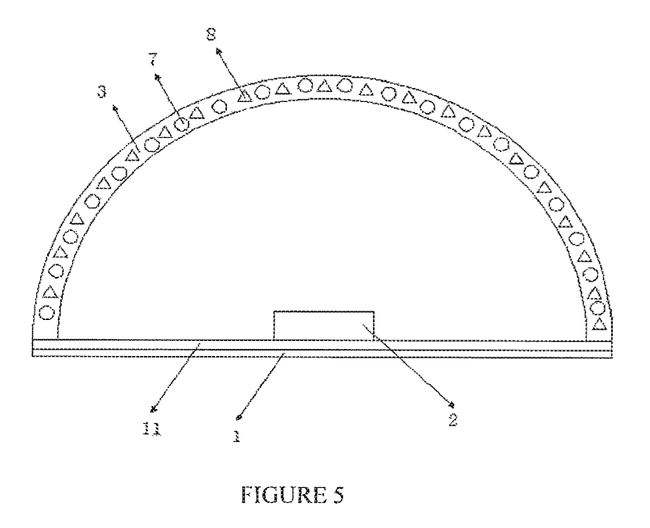

Referring to FIG. 5, as a result of further development of the first embodiment, an LED device provided by a third embodiment according to the present invention further comprises a light-reflecting layer 11 disposed on the substrate 1, while the chip 2 and the lens 3 are disposed on the light-reflecting layer 11.

When the LED device provided with a light-reflecting layer 11 works, the light emitted from the chip 2 is radiated to the light-diffusing particles 8 and diffused all around. Some of the light is diffused to the substrate 1, and the light diffused to the light-reflecting layer 11 will be reflected to the luminescent powder 7 in the lens 3, thereby improving the utilization efficiency of the light emitted from the chip 2. Therefore, as a result of further development of the LED device provided by the first embodiment, the LED device described in this embodiment further improves the luminescence uniformity and the angle of emergence, while further increasing the luminous efficiency of the LED device.

Figure 6:
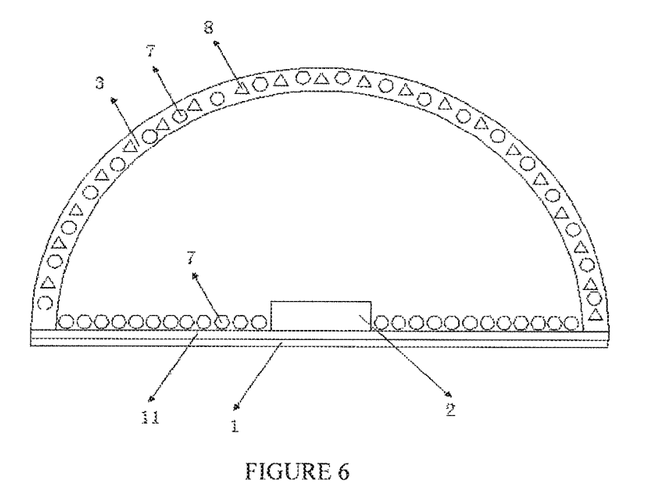
Figure 7:
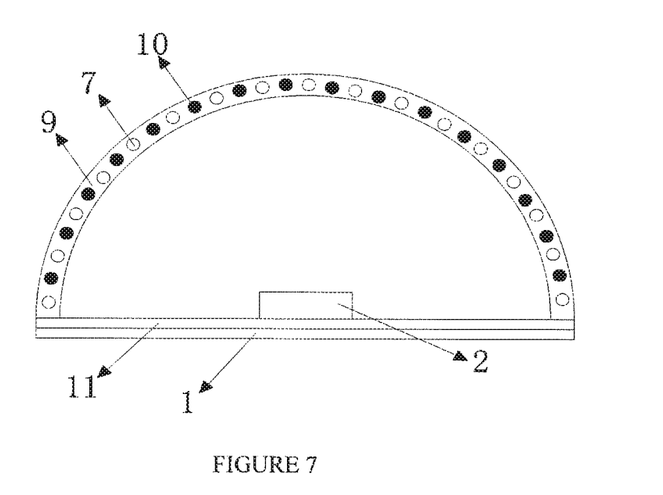

Referring to FIG. 6, as a result of further development of the first embodiment, an LED device provided by a third embodiment according to the present invention further comprises a luminescent powder layer disposed on the light-reflecting layer 11. When the light emitted from the chip 2 is diffused by the light-diffusing particles and reflected by the lens to the luminescent powder layer, the luminescent powder layer is excited to emit light. Some of the light emitted from the luminescent powder layer is transmitted by the lens, and some of the light is radiated to the light-reflecting layer and then transmitted after being reflected, thereby improving the utilization efficiency of the light emitted from the chip 2, while further improving the luminescence uniformity and the angle of emergence. The components of the luminescent powder in the luminescent powder layer on the light-reflecting layer 11 may differ from the components of the luminescent powder 7 in the lens 3. The luminescent powder layer on the light-reflecting layer 11 preferably has a thickness of 0.1 to 3000 .mu.m.

Figure 8:
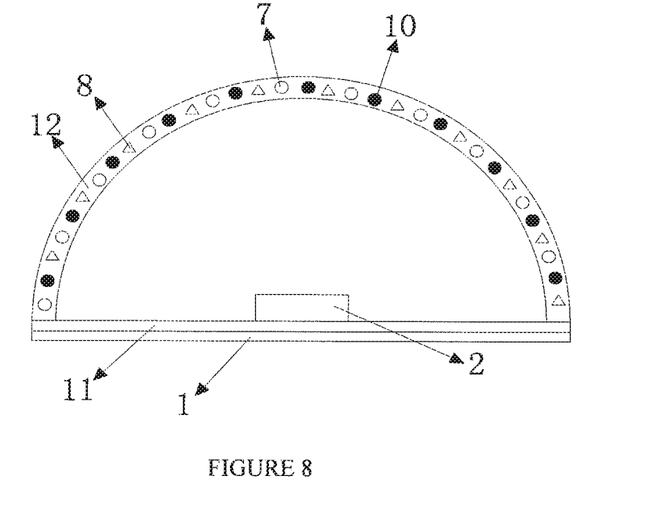

Referring to FIG. 8, as a result of further development of the second embodiment, an LED device provided by a fourth embodiment according to the present invention further comprises a light-reflecting layer 11 disposed on the substrate 1, while the chip 2 and the lens 9 are disposed on the light-reflecting layer 11. Being similar to the LED device as illustrated in FIG. 4, as a result of further development of the LED device provided by the second embodiment, the LED device as illustrated in FIG. 5 further improves the luminescence uniformity and the angle of emergence, while further increasing the luminous efficiency of the LED device.

Figure 9:
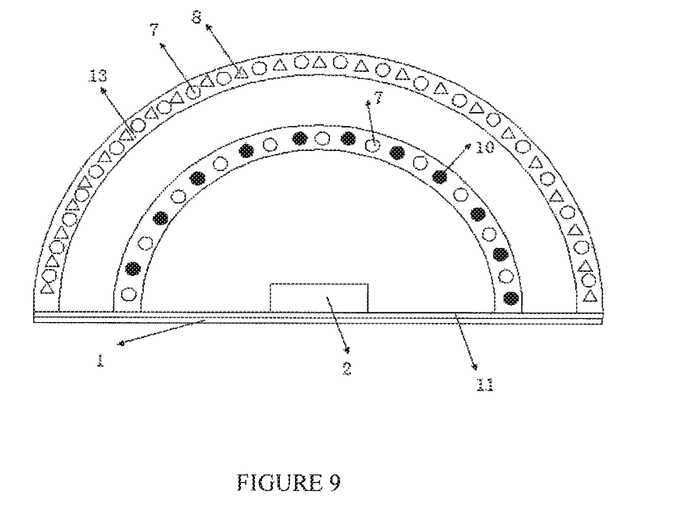

Referring to FIG. 9, as a result of further development of the fourth embodiment, an LED device provided according to a fifth embodiment of the present invention further comprises light-diffusing particles in the first lens. The LED device comprises: a substrate 1, a light-reflecting layer 11 disposed on the substrate 1, a chip 2 disposed on the light-reflecting layer 11, and a lens 12 disposed on the light-reflecting layer 11 and covering the chip 2. Luminescent powder 7, light-diffusing particles 8 and light-reflecting particles 10 are disposed at an interior of the lens 12.

In the LED device with above mentioned structure, the light emitted from the chip 2 undergoes multiple reflections by means of the light-reflecting particles 10 and the light-reflecting layer 11, thereby improving the efficiency for the light emitted from the chip to excite the luminescent powder to emit light, and reducing the amount of the light emitted from the chip which is directly emergent. Meanwhile, the light emitted from the chip 2 and the light emitted from the luminescent powder 7 is omnidirectionally reflected by the light-diffusing particles 8, thereby increasing the angle of emergence and improving the lighting uniformity of the LED device. Thus, it is beneficial to improve the luminous efficiency of the LED device. Light diffused by the combination of the light-diffusing particles 8, the light-reflecting particles 10 and the light-reflecting layer 11 is beneficial to eliminate the phenomenon of glares and flares of the LED device.

Referring to FIG. 9, as a result of further development of the fourth embodiment, an LED device provided according to a sixth embodiment of the present invention further comprises a second lens 13 disposed on the light-reflecting layer 11, at a side of a first lens 9 away from the chip 2, and covering the first lens 9. In addition, the light-diffusing particles 8 are disposed at an interior of the second lens 13. Moreover, the luminescent powder may be further disposed at the interior of the second lens 13.

In this embodiment, the second lens 13 covering the first lens 9 is disposed on the light-reflecting layer 11 for the following purposes: firstly, by disposing light-diffusing particles (and/or light-reflecting particles) at the interior of the second lens 13, the light emergent from the first lens 9 is diffused in the range of a wider angle by the light-diffusing particles and/or the light-reflecting particles at the interior of the second lens 13, thereby increasing the emergent angle of the LED device; in addition, luminescent powder may be disposed at the interior of the second lens, thereby further improving the luminous efficiency of the LED device; secondly, the second lens is farther from the chip and temperature thereon is lower than that of the first lens, so it is more beneficial to prolong the service life of the LED device; and thirdly, the luminescent powder 7 and the light-reflecting particles 10 are disposed at the interior of the second lens 9, wherein the luminescent powder 7 is generally colored and the first lens 9 is usually made of transparent glass or resin, thus the existence of the luminescent powder 7 causes the whole first lens 9 seems to be colored, and the appearance is not so beautiful; the color transmitted by the luminescent powder 7 in the first lens 9 may be shielded by disposing the second lens 13 to cover the first lens 9, so that the whole LED device looks beautiful.

The light-diffusing particles may also be added to the interior of the first lens 9. The design of such solution can be obtained from the embodiments of the specification, and herein is omitted.

As a result of further development of the sixth embodiment, an LED device provided according to a seventh embodiment of the present invention further comprises a plurality of layers of lenses, such as third and fourth lenses, disposed at an outer side of the second lens in the same way. Similarly, luminescent powder and at least one of light-diffusing particles and light-reflecting particles may be disposed at an outer surface, an inner surface or an interior of each of the plurality of layers of lenses.

Optionally, being identical to the embodiment as illustrated in FIG. 1, a support lens tightly contacting the lens 3 may also be disposed at an inner side of the lens 3 towards the chip in the sixth and seventh embodiments. When the lens 3 is made of a soft light-transmitting material, the support lens is made of a hard light-transmitting material. In this embodiment, the soft light-transmitting material may be silicone rubber, and the hard light-transmitting material may be one of glass, PMMA and PC material or combinations thereof.

In conclusion, as compared with the LED device in the conventional process, the LED device provided by the present invention can promote the luminescent powder to absorb the light emitted from the chip to the largest extent, thereby improving the luminous efficiency of the LED device. In addition, the angle of emergence is larger and the distribution of lighting intensity is more uniform.

Next, the advantages of the LED device provided by the present invention are described through examples.

Example 1

An aluminum substrate having a size of 5.5 cm.times.5.5 cm is provided, and then an Al.sub.2O.sub.3 light-reflecting layer having a thickness of 0.5 mm is formed on the substrate. Next, a blue chip having a size of 3.5 mm.times.2.8 mm is fixed at the center of the substrate by silica gel.

1.00 g yellow luminescent powder (XLLY-01A, Sichuan Sunfor Light, Co., Ltd.), 1.00 g glass beads having a medium particle diameter of 15 .mu.m, and 10 g resin (Bayer 6265 type PC material) are together put into a beaker, and stirred for 30 minutes with a stirrer. The uniformly stirred mixture is taken to form a curved lens having a curvature radius of 6 cm and a weight of 11 g through an injection process.

The obtained lens is disposed on a substrate arranged with a chip having an emission peak of 460 nm. If the lens is a flat-plate lens, a distance on the substrate from an inner side of the lens to the chip is 0.1 to 200 mm; and if the lens is a curved lens, the distance is a curvature radius value of the inner side of the lens relative to a geometric center of a surface of the chip facing the inner side of the lens. Thus the LED device KS-2 is manufactured.

The color temperature and the luminous efficiency of the LED device KS-2 are tested with a spectrum analyzer (Everfine® PMS-80 spectrum analyzer, Hangzhou Everfine Photo-E-Info Co., Ltd.). The emergent angle of the LED device is tested with a spectrometer. On the circumference of the light intensity distribution curve, an angle formed by the halves of two maximum light intensities and the original point is the angle of emergence. The uniformity of the LED device is tested as follows: the LED device is suspended; a square with a side length of 1 m is selected at a position 3 m right below of the LED device; a test point is selected at an interval of 25 cm within the square, i.e., 25 test points are selected; the illumination of each test point is tested with an illuminometer (TES01334A illuminometer, TES), and a ratio of the minimum illumination among those of the 25 test points to an average illumination is calculated as the uniformity of the LED device. The test results are shown in Table 2.

Example 2

LED devices KS-3 to KS-8 are manufactured respectively in the same way as Example 1, and the difference lies in that glass beads are doped in the amounts shown in Table 2 respectively as the light-diffusing particles, i.e., the doped amount of the light-diffusing particles is changed from 0.02 g to 0.30 g. An LED device KS-9 is manufactured based on KS-5, and the difference lies in that the light-reflecting layer is covered by the luminescent powder layer in the amount shown in Table 2. The color temperature, the luminous efficiency, the angle of emergence and the uniformity of the manufactured LED device are measured in the same method as Example 1, and the measurement results are shown in Table 2.

Comparison 1

An LED device ZL-1 is manufactured in the same way as Example 1, and the difference lies in that there is no light-reflecting layer on the substrate, and no light-diffusing particle is doped in the lens. The measurement results are shown in Table 2.

Comparison 2

An LED device KS-1 is manufactured in the same way as Example 1, and the difference lies in that there is a light-reflecting layer on the substrate, while no light-diffusing particle is doped in the lens. The measurement results are shown in Table 2.

TABLE 2

| Sample No. | Luminescent powder doped amount/g | Light-diffusing particles doped amount/g | Amount of fluorescent powder on light-reflecting layer | Color temperature/K | Luminous efficiency/(lm/W) | Angle of emergence/° | Uniformity |
|---|---|---|---|---|---|---|---|
| ZL-1 | 1.00 | 0.00 | 0.00 | 6127.0 | 65.12 | 119.1 | 0.619 |
| KS-1 | 1.00 | 0.00 | 0.00 | 6040.8 | 75.81 | 115.9 | 0.628 |
| KS-2 | 1.00 | 0.02 | 0.00 | 5875.2 | 85.09 | 121.9 | 0.636 |
| KS-3 | 1.00 | 0.05 | 0.00 | 5452.9 | 87.65 | 124.9 | 0.650 |
| KS-4 | 1.00 | 0.10 | 0.00 | 5251.6 | 95.61 | 126.0 | 0.684 |
| KS-5 | 1.00 | 0.15 | 0.00 | 4486.2 | 100.77 | 127.9 | 0.742 |
| KS-6 | 1.00 | 0.30 | 0.00 | 4306.8 | 94.73 | 125.1 | 0.721 |
| KS-7 | 1.00 | 0.50 | 0.00 | 4320.6 | 92.93 | 124.9 | 0.718 |
| KS-8 | 1.00 | 1.00 | 0.00 | 4269.1 | 80.58 | 123.5 | 0.712 |
| KS-9 | 1.00 | 0.15 | 0.50 | 4455.2 | 102.77 | 129.9 | 0.782 |

TABLE 2-continued

| Sample No. | Luminescent powder doped amount/g | Light-diffusing particles doped amount/g | Amount of fluorescent powder on light-reflecting layer | Color temperature/ K | Luminous efficiency/ (lm/W) | Angle of emergence/° | Uniformity |
|---|---|---|---|---|---|---|---|
| KS-2 | 1.00 | 0.02 | 0.00 | 5875.2 | 85.09 | 121.9 | 0.636 |
| KS-3 | 1.00 | 0.05 | 0.00 | 5452.9 | 87.65 | 124.9 | 0.650 |
| KS-4 | 1.00 | 0.10 | 0.00 | 5251.6 | 95.61 | 126.0 | 0.684 |
| KS-5 | 1.00 | 0.15 | 0.00 | 4486.2 | 100.77 | 127.9 | 0.742 |
| KS-6 | 1.00 | 0.30 | 0.00 | 4306.8 | 94.73 | 125.1 | 0.721 |
| KS-7 | 1.00 | 0.50 | 0.00 | 4320.6 | 92.93 | 124.9 | 0.718 |
| KS-8 | 1.00 | 1.00 | 0.00 | 4269.1 | 80.58 | 123.5 | 0.7102 |
| KS-9 | 1.00 | 0.15 | 0.50 | 4455.2 | 102.77 | 129.9 | 0.782 |

As can be seen from Table 2, sample ZL-1 is not added with the light-diffusing particles and not provided with the light-reflecting layer, thus it has a low luminous efficiency, an angle of emergence smaller than 120.degree., and a low uniformity. After the light-reflecting layer is disposed on the chip of the LED device, sample KS-1 has an improved luminous efficiency, an increased uniformity, while a smaller angle of emergence. As can be seen from the test results of KS-2 to KS-8, after the light-reflecting layer is disposed and the light-diffusing particles 8 are doped, the luminous efficiency, the angle of emergence and the uniformity of the manufactured LED device are all increased, while the color temperature thereof is decreased. When the doped amount of the light-diffusing particles 8 is increased from 0.02 g (i.e., the weight percentage relative to the lens is 0.2%) to 0.15 g (i.e., the weight percentage relative to the lens is 1.5%), the luminous efficiency, the angle of emergence and the uniformity of the manufactured LED device become the maximum; and when the doped amount of the light-diffusing particles 8 continues to be increased to 1.00 g (i.e., the weight percentage relative to the lens is 10%), the color temperature, the luminous efficiency, the angle of emergence and the uniformity of the LED device all tend to be decreased, but they are still higher than the properties of the two samples ZL-1 and KS-1 in Comparisons 1 and 2. As can be seen from the results of KS-9, when the light-reflecting layer is covered by the luminescent powder layer based on KS-5, the luminous efficiency, the angle of emergence and the uniformity of the obtained LED device are all increased.

Example 3

LED devices FG-1 to FG-7 are manufactured respectively in the same way as Example 1, and the difference lies in that anatase $TiO_2$ having a medium particle diameter of 150 nm are doped in the amounts shown in Table 3 respectively as the light-reflecting particles, to replace the glass beads serving as the light-diffusing particles. The color temperature, the luminous efficiency, the angle of emergence and the uniformity of the manufactured LED device are measured in the same way as Example 1, and the measurement results are shown in Table 3.

TABLE 3

| Sample No. | Luminescent powder doped amount/g | Anatase $TiO_2$ doped amount/g | Color temperature/ K | Luminous efficiency/ (lm/W) | Angle of emergence/° | Uniformity |
|---|---|---|---|---|---|---|
| FG-1 | 1.00 | 0.002 | 6267.0 | 73.19 | 130.2 | 0.645 |
| FG-2 | 1.00 | 0.005 | 5651.4 | 83.45 | 135.3 | 0.688 |
| FG-3 | 1.00 | 0.01 | 5477.4 | 92.07 | 141.6 | 0.744 |
| FG-4 | 1.00 | 0.02 | 4614.5 | 98.84 | 149.5 | 0.801 |
| FG-5 | 1.00 | 0.03 | 4441.6 | 95.50 | 150.7 | 0.803 |
| FG-6 | 1.00 | 0.05 | 4410.7 | 87.76 | 150.2 | 0.802 |
| FG-7 | 1.00 | 0.10 | 4395.3 | 78.36 | 150.1 | 0.798 |

As can be seen from Table 3, with the doping of the anatase $TiO_2$, the angle of emergence, the uniformity and the luminous efficiency of the manufactured LED device are increased, while the color temperature is decreased. When the doped amount of the anatase $TiO_2$ is increased from 0.002 g (i.e., the weight percentage relative to the lens is 0.02%) to 0.08 g (i.e., the weight percentage relative to the lens is 0.8%), the luminous efficiency, the angle of emergence and the uniformity of the sample become the maximum; and when the doped amount of the anatase $TiO_2$ continues to be increased to 0.1 g (i.e., the weight percentage relative to the lens is 1%), the angle of emergence and the uniformity of the sample have no obvious change, the luminous efficiency is decreased, while the color temperature keeps a downtrend along with the increase of the doped amount of the anatase $TiO_2$.

Example 4

LED devices SC-1 to SC-7 are manufactured respectively in the same way as Example 1, and the difference lies in that anatase TiO₂ having a medium particle diameter of 150 nm are doped as light-reflecting particles, and glass beads having a medium particle diameter of 15 μm are doped as light-diffusing particles in the amounts shown in Table 4, respectively. The color temperature, the luminous efficiency, the angle of emergence and the uniformity of the manufactured LED device are measured in the same way as Example 1, and the measurement results are shown in Table 4.

TABLE 4

| Sample No. | Luminescent powder doped amount/g | Light-diffusing particles doped amount/g | Anatase $TiO_2$ doped amount/g | Color temperature/ K | Luminous efficiency/ (lm/W) | Angle of emergence/° | Uniformity |
|---|---|---|---|---|---|---|---|
| SC-1 | 1.00 | 0.15 | 0.01 | 5477.4 | 93.80 | 145.5 | 0.724 |
| SC-2 | 1.00 | 0.15 | 0.02 | 4778.7 | 99.26 | 149.9 | 0.803 |
| SC-3 | 1.00 | 0.15 | 0.03 | 4441.6 | 96.22 | 149.2 | 0.804 |
| SC-4 | 1.00 | 0.15 | 0.05 | 4410.7 | 87.64 | 149.3 | 0.801 |
| SC-5 | 1.00 | 0.05 | 0.02 | 4649.1 | 94.25 | 145.9 | 0.723 |
| SC-6 | 1.00 | 0.10 | 0.02 | 4636.5 | 96.33 | 147.8 | 0.805 |
| SC-7 | 1.00 | 0.20 | 0.02 | 4631.4 | 95.93 | 148.2 | 0.806 |
| SC-8 | 1.00 | 0.30 | 0.02 | 4634.2 | 82.83 | 148.0 | 0.807 |

As can be seen from Table 4, when the doped amounts of the yellow luminescent powder and the light-diffusing particles (glass beads) are given, along with the increase of the doped amount of the anatase TiO₂, the angle of emergence and the uniformity of the LED device are gradually increased, while the color temperature thereof is gradually decreased. When the doped amount of the anatase TiO₂ is 0.02 g (i.e., the weight percentage relative to the lens is 0.2%), the luminous efficiency of the sample becomes the maximum. When the doped amount of the anatase TiO₂ continues to be increased, the luminous efficiency of the LED device tends to be decreased. When the doped amounts of the yellow luminescent powder and the anatase TiO₂ are given, along with the increase of the doped amount of the light-diffusing particles, the angle of emergence and the uniformity of the LED device are gradually increased. When the doped amount of the light-diffusing particles is 0.15 g (i.e., the weight percentage relative to the lens is 1.5%), the luminous efficiency of the sample becomes the maximum, while when the doped amount of the light-diffusing particles continues to be increased, the luminous efficiency of the LED device tends to be decreased.

Example 5

Provided are an aluminum substrate having a size of 5.5 cm.times.5.5 cm, and a curved lens which is made of a PC material (Bayer 6265) and which has a curvature radius of 6 cm and a weight of 10 g. Then an Al₂O₃ light-reflecting layer having a thickness of 0.5 mm is formed on the substrate. A blue chip having a size of 3.5 mm.times.2 8 mm is fixed at the center of the substrate by silica gel. 1.00 g yellow luminescent powder (XLLY-01A, Sichuan Sunfor Light, Co., Ltd.), 1.00 g glass beads having a medium particle diameter of 15 μm, and 10.00 g thermoplastic acrylic resin (H01-4, Chengdu Caixing Technolgies Co., Ltd.) are together put into a beaker, and stirred for 30 minutes with a stirrer. The uniformly stirred mixture is coated on the inner wall of the lens for a thickness of 0.5 mm, and kept constantly in the 60.degree. C. oven for 3 hours. The lens is taken out when its temperature drops to the room temperature, and disposed on a substrate arranged with a chip, so that a curvature radius of an inner surface of the lens relative to a geometric center of a surface of the chip facing the lens is 0.1 to 200 mm. Thus the LED device is manufactured.

The color temperature, the luminous efficiency, the angle of emergence and the uniformity of the manufactured LED device are measured in the same method as Example 1, and the measurement results are shown by PT-1 in Table 5.

Example 6

LED devices are manufactured in the same way as Example 5, and the difference lies in that based on the weight of the thermoplastic acrylic resin, 1% anatase TiO₂ having a medium particle diameter of 160 nm are doped as light-reflecting particles to replace the glass beads serving as light-diffusing particles. The color temperature, the luminous efficiency, the angle of emergence and the uniformity of the manufactured LED device are measured in the same method as Example 1, and the measurement results are shown by PT-2 in Table 5.

Example 7

LED devices are manufactured in the same way as Example 5, and the difference lies in that based on the weight of the thermoplastic acrylic resin, 0.2% anatase TiO₂ having a medium particle diameter of 160 nm are doped as light-reflecting particles, and 10% glass beads having a medium particle diameter of 15 μm are doped as light-diffusing particles. The color temperature, the luminous efficiency, the angle of emergence and the uniformity of the manufactured LED device are measured in the same method as Example 1, and the measurement results are shown by PT-3 in Table 5.

Example 8

LED devices are manufactured in the same way as Examples 5 to 7, respectively, and the difference lies in that the coating covers the outer surface of the lens. The color temperature, the luminous efficiency, the angle of emergence and the uniformity of the manufactured LED device are measured in the same method as Example 1, and the measurement results are shown by PT-4 to PT-6 in Table 5.

TABLE 5

| Sample No. | Luminescent powder doped amount/g | Light-diffusing particles doped amount/g | Anatase TiO$_2$ doped amount/g | Color temperature/ K | Luminous efficiency/ (lm/W) | Angle of emergence/° | Uniformity |
|---|---|---|---|---|---|---|---|
| PT-1 | 1.00 | 1.00 | 0.00 | 5096.20 | 100.75 | 128.90 | 0.748 |
| PT-2 | 1.00 | 0.00 | 0.10 | 4933.20 | 99.01 | 148.50 | 0.804 |
| PT-3 | 1.00 | 1.00 | 0.20 | 4778.70 | 99.26 | 149.90 | 0.806 |
| PT-4 | 1.00 | 1.00 | 0.00 | 5094.20 | 99.71 | 128.20 | 0.743 |
| PT-5 | 1.00 | 0.00 | 0.10 | 4936.20 | 98.22 | 148.10 | 0.801 |
| PT-6 | 1.00 | 1.00 | 0.20 | 4782.70 | 98.16 | 149.20 | 0.798 |

Example 9

Provided are an aluminum substrate having a size of 6.5 cm×6.5 cm, and two curved lenses which are made of a PC material (Bayer 6265) and which have curvature radiuses of 2.5 cm and 3 cm, respectively (hereinafter referred to as a first lens and a second lens, respectively). Then an Al$_2$O$_3$ light-reflecting layer having a thickness of 0.5 mm is formed on the substrate. A blue chip having a size of 3.5 mm×2.8 mm is fixed at the center of the substrate by silica gel.

2.00 g yellow luminescent powder (XLLY-01A, Sichuan Sunfor Light, Co., Ltd.), 2.00 g glass beads having a medium particle diameter of 15 μm, and 20.00 g thermoplastic acrylic resin (H01-4, Chengdu Caixing Technologies Co., Ltd.) are together put into a beaker, and stirred for 30 minutes with a stirrer. On the inner walls of the first and second lenses, the uniformly stirred mixture is coated with a thickness of 0.5 mm, and constantly kept in the 60° C. oven for 3 hours. The first and second lenses are taken out when their temperatures drop to the room temperature, and orderly disposed on a substrate arranged with a chip. The distance between the first lens and the chip is a curvature radius of an inner side of the first lens relative to a geometric center of a surface of the chip facing the first lens, which is valued as 0.1 to 200 mm. The distance between the first and second lenses is 0.1 to 200 mm. Thus the LED device is manufactured.

The color temperature, the luminous efficiency, the angle of emergence and the uniformity of the manufactured LED device are measured in the same method as Example 1, and the measurement results are shown by ST-1 in Table 6.

Example 10

LED devices are manufactured in the same way as Example 5, and the difference lies in that based on the weight of the thermoplastic acrylic resin, 1% anatase TiO$_2$ having a medium particle diameter of 160 nm are doped as light-reflecting particles to replace the glass beads serving as light-diffusing particles. The color temperature, the luminous efficiency, the angle of emergence and the uniformity of the manufactured LED device are measured in the same method as Example 1, and the measurement results are shown by ST-2 in Table 6.

Example 11

LED devices are manufactured in the same way as Example 5, and the difference lies in that based on the weight of the thermoplastic acrylic resin, 0.2% anatase TiO$_2$ having a medium particle diameter of 160 nm are doped as light-reflecting particles, and 10% glass beads having a medium particle diameter of 15 μm are doped as light-diffusing particles. The color temperature, the luminous efficiency, the angle of emergence and the uniformity of the manufactured LED device are measured in the same method as Example 1, and the measurement results are shown by ST-3 in Table 6.

Example 12

LED devices are manufactured in the same way as Example 5, and the difference lies in that no glass bead is added. The color temperature, the luminous efficiency, the angle of emergence and the uniformity of the manufactured LED device are measured in the same method as Example 1, and the measurement results are shown by ST-4 in Table 6.

Example 13

LED devices are manufactured in the same way as Examples 5 to 7, respectively, and the difference lies in that the coating covers the outer surface of the lens. The color temperature, the luminous efficiency, the angle of emergence and the uniformity of the manufactured LED device are measured in the same method as Example 1, and the measurement results are shown by ST-5 to ST-7 in Table 6.

TABLE 6

| Sample No. | Luminescent powder doped amount/g | Light-diffusing particles doped amount/g | Anatase TiO$_2$ doped amount/g | Color temperature/K | Luminous efficiency/(lm/W) | Angle of emergence/° | Uniformity |
|---|---|---|---|---|---|---|---|
| ST-1 | 2.00 | 2.00 | 0.00 | 5102.26 | 100.75 | 128.81 | 0.749 |
| ST-2 | 2.00 | 0.00 | 0.20 | 4946.37 | 99.05 | 148.55 | 0.804 |
| ST-3 | 2.00 | 2.00 | 0.40 | 4783.40 | 99.31 | 150.08 | 0.805 |
| ST-4 | 2.00 | 0.00 | 0.00 | 3783.40 | 95.31 | 124.08 | 0.705 |
| ST-5 | 2.00 | 2.00 | 0.00 | 5097.69 | 99.71 | 128.81 | 0.744 |
| ST-6 | 2.00 | 0.00 | 0.20 | 4941.69 | 98.24 | 148.21 | 0.801 |
| ST-7 | 2.00 | 2.00 | 0.40 | 4788.08 | 98.14 | 149.14 | 0.799 |

TABLE 6

| Sample No. | Luminescent powder doped amount/g | Light-diffusing particles doped amount/g | Anatase TiO$_2$ doped amount/g | Color temperature/ K | Luminous efficiency/ (lm/W) | Angle of emergence/° | Uniformity |
|---|---|---|---|---|---|---|---|
| ST-1 | 2.00 | 2.00 | 0.00 | 5102.26 | 100.75 | 128.81 | 0.749 |
| ST-2 | 2.00 | 0.00 | 0.20 | 4946.37 | 99.05 | 148.55 | 0.804 |
| ST-3 | 2.00 | 2.00 | 0.40 | 4783.40 | 99.31 | 150.08 | 0.805 |
| ST-4 | 2.00 | 0.00 | 0.00 | 3783.40 | 95.31 | 124.08 | 0.705 |
| ST-5 | 2.00 | 2.00 | 0.00 | 5097.69 | 99.71 | 128.81 | 0.744 |
| ST-6 | 2.00 | 0.00 | 0.20 | 4941.69 | 98.24 | 148.21 | 0.801 |
| ST-7 | 2.00 | 2.00 | 0.40 | 4788.08 | 98.14 | 149.14 | 0.799 |

Example 14

LED devices are manufactured in the same way as Examples 9 to 13, respectively, and the difference lies in that a third lens and a fourth lens are disposed in the same way. The color temperature, the luminous efficiency, the angle of emergence and the uniformity of the manufactured LED device are measured in the same method as Example 1, and the measurement results are shown in Table 7.

TABLE-US-00007 TABLE 7 First lens Second lens Third Fourth lens Fluorescent Fluorescent Light-lens Light-powder powder diffusing Anatase Fluorescent diffusing doped doped particles TiO.sub.2 powder particles Luminous Sample amount/amount/doped doped doped doped Color efficiency/Emergency No. g g amount/g amount/g amount/g amount/g temperature/K (lm/W) angle/.degree. Uniformity SC-1 0.2 1.00 0.15 0.08 0.2 0.002 4568.7 86.23 134.5 0.803 SC-2 0.2 1.00 0.15 0.10 0.2 0.004 4531.6 84.21 137.7 0.814 SC-3 0.2 1.00 0.15 0.12 0.2 0.006 4501.7 83.34 141.5 0.826 SC-4 0.2 1.00 0.05 0.08 0.2 0.008 4526 80.22 143.3 0.838 SC-5 0.2 1.00 0.10 0.08 0.2 0.010 4514 77.30 144.1 0.838 SC-6 0.2 1.00 0.20 0.08 0.2 0.015 4522 75.73 144.3 0.842 SC-7 0.2 1.00 0.30 0.08 0.2 0.020 4525 74.63 144.2 0.843

TABLE 7

| Sample No. | First lens Fluorescent powder doped amount/g | Second lens Fluorescent powder doped amount/g | Second lens Light-diffusing particles doped amount/g | Second lens Anatase TiO$_2$ doped amount/g | Third lens Fluorescent powder doped amount/g | Fourth lens Light-diffusing particles doped amount/g | Color temperature/ K | Luminous efficiency/ (lm/W) | Emergency angle/° | Uniformity |
|---|---|---|---|---|---|---|---|---|---|---|
| SC-1 | 0.2 | 1.00 | 0.15 | 0.08 | 0.2 | 0.002 | 4568.7 | 86.23 | 134.5 | 0.803 |
| SC-2 | 0.2 | 1.00 | 0.15 | 0.10 | 0.2 | 0.004 | 4531.6 | 84.21 | 137.7 | 0.814 |
| SC-3 | 0.2 | 1.00 | 0.15 | 0.12 | 0.2 | 0.006 | 4501.7 | 83.34 | 141.5 | 0.826 |
| SC-4 | 0.2 | 1.00 | 0.05 | 0.08 | 0.2 | 0.008 | 4526 | 80.22 | 143.3 | 0.838 |
| SC-5 | 0.2 | 1.00 | 0.10 | 0.08 | 0.2 | 0.010 | 4514 | 77.30 | 144.1 | 0.838 |
| SC-6 | 0.2 | 1.00 | 0.20 | 0.08 | 0.2 | 0.015 | 4522 | 75.73 | 144.3 | 0.842 |
| SC-7 | 0.2 | 1.00 | 0.30 | 0.08 | 0.2 | 0.020 | 4525 | 74.63 | 144.2 | 0.843 |

Example 15

Provided are an aluminum substrate having a size of 5.5 cm.times.5.5 cm, and a curved lens which has a curvature radius of 6 cm and a weight of 10 g as a support lens. Then an Al.sub.2O.sub.3 light-reflecting layer having a thickness of 0.5 mm is formed on the substrate. A blue chip having a size of 3.5 mm.times.2.8 mm is fixed at the center of the substrate by silica gel.

0.80 g yellow luminescent powder (XLLY-01A, Sichuan Sunfor Light, Co., Ltd.), 1.20 g glass beads having a medium particle diameter of 15 .mu.m, and 2.00 g silicone rubber (Dow Corning RBB-2420) are mixed together, then kneaded for 30 minutes with a masticator (X(S)N-10) and kept under a constant temperature of 150.degree. C. with a laminator. The uniformly stirred mixture is pressed into the shape of the support lens to form a film, and then the outer side of the support lens is covered with the film. Thus, the LED device is manufactured.

The color temperature, the luminous efficiency, the angle of emergence and the uniformity of the manufactured LED device are measured in the same method as Example 1, and the measurement results are shown by ZC-1 in Table 8.

Example 16

LED devices are manufactured in the same way as Example 15, and the difference lies in that 1.00 g anatase TiO.sub.2 having a medium particle diameter of 160 nm are doped as light-reflecting particles to replace the glass beads serving as light-diffusing particles. The color temperature, the luminous efficiency, the angle of emergence and the uniformity of the manufactured LED device are measured in the same method as Example 1, and the measurement results are shown by ZC-2 in Table 8.

Example 17

LED devices are manufactured in the same way as Example 15, and the difference lies in that 1.00 g anatase TiO.sub.2 having a medium particle diameter of 160 nm are doped as light-reflecting particles, and 1.20 g glass beads having a medium particle diameter of 15 .mu.m are doped as light-diffusing particles. The color temperature, the luminous efficiency, the angle of emergence and the uniformity of the manufactured LED device are measured in the same method as Example 1, and the measurement results are shown by ZC-3 in Table 8.

TABLE 8

| Sample No. | Silicone rubber doped amount/g | Luminescent powder doped amount/g | Light-diffusing particles doped amount/g | Anatase TiO2 doped amount/g | Color temperature/K | Luminous efficiency/(lm/W) | Angle of emergence/° | Uniformity |
|---|---|---|---|---|---|---|---|---|
| ZC-1 | 2.00 | 0.80 | 1.20 | 0.00 | 5011.2 | 110.75 | 129.9 | 0.767 |
| ZC-2 | 2.00 | 0.80 | 0.00 | 1.00 | 4903.2 | 107.01 | 149.5 | 0.814 |
| ZC-3 | 2.00 | 0.80 | 1.20 | 1.00 | 4766.7 | 108.86 | 150.9 | 0.816 |

The embodiments in the specification are described in a progressive manner, and for each of the embodiments, its difference from other embodiments is mainly described. The association and similarity between the embodiments may refer to each other.

Through the above descriptions of the disclosed embodiments, a person skilled in the art can implement or use the present invention. Various modifications to those embodiments are obvious for a person skilled in the art, and the general principle defined herein may be implemented in other embodiments without deviating from the spirit or scope of the present invention. Therefore, the present invention is not limited to the embodiments described herein, but complies with a widest range consistent with the principles and novel characteristics disclosed herein.

What is claimed is:

1. A light-emitting diode (LED) device, comprising:
   a substrate;
   a chip disposed on the substrate;
   a first lens disposed on the substrate and spaced from the chip; and
   a part of light-reflecting layer disposed on the substrate and not covered by the chip;
   wherein the first lens comprises a first luminescent powder, first light-diffusing particles and first light-reflecting particles.

2. The LED device according to claim 1, wherein the first luminescent powder, the fit light-diffusing particles and the first light-reflecting particles are individually disposed at an inner surface, an outer surface or an interior of the first lens, respectively.

3. The LED device according claim 1, wherein the first light-diffusing particles have a medium particle diameter of 0.5 to 1000 μm.

4. The LED device according to claim 1, wherein the first light-reflecting particles have a medium particle diameter of 0.05 to 1000 μm.

5. The LED device according to claim 1, further comprising:
   a second lens disposed on an outer side of the first lens away from the chip in a manner of being spaced from the first lens.

6. The LED device according to claim 5, wherein,
   the second lens comprises at least one of second light-diffusing particles and second light-reflecting particles disposed at an outer surface, an inner surface or an interior of the second lens.

7. The LED device according to claim 6, wherein,
   the second lens further comprises a second luminescent powder disposed at the outer surface, the inner surface or the interior of the second lens.

8. The LED device according to claim 6, wherein a distance between an inner side of the second lens and the outer side of the first lens is 0.1 to 200 mm.

9. The LED device according to claim 1, wherein the first light-reflecting particles comprise one or more of $TiO_2$, ZnO, $BaSO_4$, $CaCO_3$, and a composite material consisting of $TiO_2$ and $CaSO_4$.

10. The LED device according to claim 9, wherein the $TiO_2$ is a rutile $TiO_2$ or an anatase $TiO_2$.

11. A light-emitting diode (LED) device, comprising:
    a substrate;
    a chip disposed on the substrate; and
    a first lens disposed on the substrate and spaced from the chip;
    wherein the first lens comprises a first luminescent powder, first light-diffusing particles and first light-reflecting particles,
    wherein the first light-diffusing particles have a refractive index of 1.20 to 2.40.

12. A light-emitting diode (LED) device, comprising:
    a substrate;
    a chip disposed on the substrate; and
    a first lens disposed on the substrate and spaced from the chip;
    wherein the first lens comprises a first luminescent powder, first light-diffusing particles and first light-reflecting particles, and wherein based on a total mass of the first lens, contents of the first light-reflecting particles, the first light-diffusing particles and the first luminescent powder are 0.01 wt % to 80 wt %, 0.05 wt % to 80 wt %, and 1 wt % to 99 wt %, respectively.

13. A light-emitting diode (LED) device, comprising:
    a substrate;
    a chip disposed on the substrate; and
    a first lens disposed on the substrate and spaced from the chip;
    wherein the first lens comprises a first luminescent powder, first light-diffusing particles and first light-reflecting particles,
    wherein the LED device further comprising:
    a second lens disposed on an outer side of the first lens away from the chip in a manner of being spaced from the first lens; and
    a plurality of layers of lenses disposed at an outer side of the second lens away from the first lens in a manner of being spaced from the second lens and spaced from each other.

14. The LED device according to claim 13, wherein each of the plurality of layers of lenses comprises at least one of the second light-diffusing particles and the second light-reflecting particles and/or the first luminescent powder disposed at an outer surface, an inner surface or an interior.

15. A light-emitting diode (LED) device, comprising:
a substrate;
a chip disposed on the substrate; and
a first lens disposed on the substrate and spaced from the chip;
wherein the first lens comprises a first luminescent powder, first light-diffusing particles and first light-reflecting particles, and
wherein the LED device further comprising:
a support lens disposed at an inner side of the first lens close to the chip, and tightly contacted with the first lens.

16. A method for manufacturing a light-emitting diode (LED) device, comprising:
providing a substrate;
disposing a chip on the substrate;
individually disposing a luminescent powder, light-diffusing particles and light-reflecting particles on an outer surface, an inner surface or an interior of a first lens, respectively;
disposing the first lens having the luminescent powder and at least one of the light-diffusing particles and the light-reflecting particles on a side of the substrate where the chip is disposed, so that the first lens is spaced from the chip;
disposing a second lens at an outer side of the first lens away from the chip, in a manner of being spaced from the first lens; and
disposing a plurality of layers of lenses at an outer side of the second lens away from the first lens, in a manner of being spaced from each other.

17. The method for manufacturing an LED device according to claim 16, further comprising:
forming a light-reflecting layer on the substrate before disposing the chip, so that the chip is located on the light-reflecting layer.

* * * * *